United States Patent
Kirchhof (10) Patent No.: US 11,217,619 B2
(45) Date of Patent: Jan. 4, 2022

(54) SENSOR DEVICE AND METHOD OF MANUFACTURING THE SAME

(71) Applicant: Fraunhofer-Gesellschaft zur Förderung der angewandten Forschung e.V., Munich (DE)

(72) Inventor: Christian Kirchhof, Dresden (DE)

(73) Assignee: FRAUNHOFER-GESELLSCHAFT ZUR FÖRDERUNG DER ANGEWANDTEN FORSCHUNG E.V., Munich (DE)

( * ) Notice: Subject to any disclaimer, the term of this patent is extended or adjusted under 35 U.S.C. 154(b) by 57 days.

(21) Appl. No.: 16/699,957

(22) Filed: Dec. 2, 2019

(65) Prior Publication Data

US 2020/0105817 A1 Apr. 2, 2020

Related U.S. Application Data (63) Continuation of application No. PCT/EP2018/064276, filed on May 30, 2018.

(30) Foreign Application Priority Data

Jun. 6, 2017 (DE) ...................... 10 2017 209 498.2

(51) Int. Cl.
H01L 27/146 (2006.01)

(52) U.S. Cl.
CPC .. H01L 27/14643 (2013.01); H01L 27/14607 (2013.01)

(58) Field of Classification Search
CPC ......... H01L 27/14643; H01L 27/14607; H01L 27/302; H01L 27/305; H01L 27/144
See application file for complete search history.

(56) References Cited

U.S. PATENT DOCUMENTS

| 6,278,055 B1 | 8/2001 | Forrest et al. |
| 6,340,789 B1 | 1/2002 | Petritsch et al. |

(Continued)

FOREIGN PATENT DOCUMENTS

| DE | 3709614 A1 | 10/1988 |
| DE | 000069934786 T | 10/2007 |

(Continued)

OTHER PUBLICATIONS

Japanese Office Action, dated Dec. 18, 2020, in the parallel patent application No. 2019-567275.

(Continued)

Primary Examiner — Tony Ko
(74) Attorney, Agent, or Firm — McClure, Qualey & Rodack, LLP (57) ABSTRACT

A sensor device for detecting an incident energy beam, the sensor device having stacked layers, the layers having: a first photodiode layer, at least four measuring contacts being arranged on electrode layers of the first photodiode layer, at each of which a partial current of a photocurrent dependent on the incident energy beam can be tapped, to determine an x and y coordinate in the three-dimensional coordinate system; and a second photodiode layer fixed to the first photodiode layer, at least four measuring contacts being arranged on electrode layers of the second photodiode layer, at each of which a partial current of a photocurrent dependent on the incident energy beam can be tapped, to determine an x and y coordinate in the three-dimensional coordinate system; wherein at least one of the photodiode layers is transparent.

10 Claims, 4 Drawing Sheets

(56) References Cited

U.S. PATENT DOCUMENTS

| | | | |
|---|---|---|---|
| 6,429,417 | B1 | 8/2002 | Street et al. |
| 2002/0008205 | A1 | 1/2002 | Kurfess et al. |
| 2004/0178325 | A1 | 9/2004 | Forrest et al. |
| 2007/1766165 | | 8/2007 | Forrest et al. |
| 2012/0026273 | A1 | 2/2012 | Wagner et al. |
| 2014/0060613 | A1 | 5/2014 | So et al. |
| 2014/0291480 | A1 | 10/2014 | Bruder et al. |
| 2015/0137088 | A1 | 5/2015 | Simon et al. |
| 2018/0329024 | A1* | 11/2018 | Send .................. G01S 17/46 |

FOREIGN PATENT DOCUMENTS

| | | | |
|---|---|---|---|
| DE | 102008039473 | A1 | 3/2010 |
| DE | 102008048 572 | A1 | 11/2014 |
| DE | 102013207630 | A1 | 11/2014 |
| JP | S5950579 | A | 3/1984 |
| JP | H02170004 | A | 6/1990 |
| JP | H06167305 | A | 6/1994 |
| JP | H09246236 | A | 9/1997 |
| JP | 2013061268 | A | 4/2013 |
| JP | 2014511041 | A | 5/2014 |
| KR | 10201100 93453 | A | 8/2011 |
| WO | 002009024467 | A1 | 2/2009 |
| WO | 2013190434 | A1 | 12/2013 |

OTHER PUBLICATIONS

English Translation Japanese Office Action, dated Dec. 18, 2020, in the parallel patent application No. 2019-567275.

Anssi Mäkynen: Position-Sensitive Devices and Sensor Systems for optical Tracking and Displacement Sensing Application. Dissertation, Faculty of Technology, University of Oulu, 2000.

J. T. Wallmark: A new semiconductor photocell using lateral photoeffect. Proceedings of the IRE, vol. 45, S. 474-483, 1957-.

Schmidt, Wolf-Dieter (2007): Sensorschaltungstechnik. 3. überarb. Aufl. Würzburg: Vogel (Vogel-Fachbuch, 8), Seite 178 ff.

M. Jahnel: Integration of near infrared and visible organic photodiodes on a complementary metal-oxide-semiconductor compatible backplane, Thin Solid Films 592 (2015), S. 94-98.

Eiji Takada: Application of a Heterojunction Organic Photodiode to Radiation Measurement, 2009 IEEE Nuclear Science Symposium Conference Record, S.1295-1299.

Henrik Andersson: Position Sensitive Detectors: Device Technology and Applications in Spectroscopy. Dissertation, Department of Information, Technology and Media, Mid Sweden University, Sundsvall, Sweden, 2008, S. 17ff.

Internet:http://www.micro-epsilon.de/displacement-position-sensors/laser-sensor/optoNCDT_1610/index.html, Jan. 2016.

Internet:http://www.first-sensor.com/de/produkte/optische-sensoren/detektoren/positionsempfindliche -dioden-psd/, Jan. 2016.

Internet: https://www.hamamatsu.com/resources/pdf/ssd/e02_handbook_si_photodiode.pdf, Jan. 2016.

Saeed Olyaee, Morteza Rezazadeh: 3-D Measurement by Dual Four-Quadrant Position-Sensitive Detectors in the Stereo Mode, International Journal of Engineering Research and Applications (IJERA) www.ijera.com vol. 2, Issue 3, May-Jun. 2012, pp. 1157-1161 1157.

* cited by examiner

SENSOR DEVICE AND METHOD OF MANUFACTURING THE SAME

CROSS-REFERENCE TO RELATED APPLICATIONS

This application is a continuation of copending International Application No. PCT/EP2018/064276, filed May 30, 2018, which is incorporated herein by reference in its entirety, and additionally claims priority from German Application No. 10 2017 209 498.2, filed Jun. 6, 2017, which is also incorporated herein by reference in its entirety.

BACKGROUND OF THE INVENTION

The invention relates to a sensor device for detecting an incident energy beam. More precisely, the invention relates to an analog sensor device which—in contrast to digital sensor devices—provides continuous position information regarding the incident energy beam. Well-known analog sensor devices for detecting an incident light beam have a position-sensitive photodiode which is manufactured in silicon technology. Analog sensor devices are known which make it possible to determine the position of the incident energy beam one-dimensionally or two-dimensionally.

SUMMARY

An embodiment may have a sensor device for detecting an incident energy beam, the sensor device having layers stacked in a z-direction of a three-dimensional coordinate system, which are aligned parallel to an xy plane of the three-dimensional coordinate system, the layers having: a first photodiode layer, the first photodiode layer having one or more organic photoactive layers interposed between two electrode layers of the first photodiode layer, wherein at least four measuring contacts are arranged on the electrode layers of the first photodiode layer, at each of which measuring contacts a partial current of a photocurrent of the first photodiode layer dependent on the incident energy beam can be tapped, so that an x coordinate and a y coordinate in the three-dimensional coordinate system of the incident energy beam in the photoactive layers of the first photodiode layer can be determined from measurements of the at least four partial currents of the first photodiode layer; and a second photodiode layer fixed to the first photodiode layer, the second photodiode layer having one or more organic photoactive layers interposed between two electrode layers of the second photodiode layer, wherein at least four measuring contacts are arranged on the electrode layers of the second photodiode layer, at each of which measuring contacts a partial current of a photocurrent of the second photodiode layer dependent on the incident energy beam can be tapped, so that an x coordinate and a y coordinate in the three-dimensional coordinate system of the incident energy beam in the photoactive layers of the second photodiode layer can be determined from measurements of the at least four partial currents of the second photodiode layer; wherein at least one of the photodiode layers is transparent.

According to another embodiment, a method of manufacturing a sensor device for detecting an incident energy beam, wherein layers stacked in a z-direction of a three-dimensional coordinate system are formed which are aligned parallel to an xy plane of the three-dimensional coordinate system, may have the steps of: forming a first photodiode layer such that the first photodiode layer has one or more organic photoactive layers which are interposed between two electrode layers of the first photodiode layer, so that at least four measuring contacts are arranged on the electrode layers of the first photodiode layer, at each of which measuring contacts a partial current of a photocurrent dependent on the incident energy beam can be tapped, so that an x coordinate and a y coordinate in the three-dimensional coordinate system of the incident energy beam in the photoactive layers of the first photodiode layer can be determined from measurements of the at least four partial currents of the first photodiode layer; and forming a second photodiode layer such that the second photodiode layer is fixed to the first photodiode layer so that the second photodiode layer has one or more organic photoactive layers interposed between two electrode layers of the second photodiode layer so that at least four measuring contacts are arranged on the electrode layers of the second photodiode layer, at each of which measuring contacts a partial current of a photocurrent dependent on the incident energy beam can be tapped, so that an x coordinate and a y coordinate in the three-dimensional coordinate system of the incident energy beam in the photoactive layers of the second photodiode layer can be determined from measurements of the at least four partial currents of the second photodiode layer; wherein at least one of the photodiode layers is implemented to be transparent.

An energy beam is a bundle of essentially parallel energy rays with a small cross-section compared to a sensor area of the sensor device.

One or more of the stacked layers can be formed over the full area. Similarly, one or more of the stacked layers may be planar.

The first photodiode layer and the second photodiode layer can be implemented for detecting electromagnetic energy rays, especially in the infrared and/or visible light ranges.

The desired spectral sensitivity can be achieved by appropriately selecting the one or more photoactive layers and/or the two electrode layers of the first photodiode layer and by appropriately selecting the one or more photoactive layers and/or the two electrode layers of the second photodiode layer. Advantageously, the first photodiode layer and the second photodiode layer have the same spectral sensitivity, so that an incident energy beam with defined spectral properties, which can be detected by the first photodiode layer, can also be detected by the second photodiode layer.

A photodiode layer is described as being transparent if it allows a significant part of the energy of the energy beam to be detected, for example 50% or more, to pass through it. In principle, it is sufficient if one of the two photodiode layers is transparent. In this case, however, the sensor device is only able to detect in the intended way energy beams that are incident on the side of the transparent photodiode layer. However, if both photodiode layers are transparent, then energy beams can be detected in the intended way, regardless of which side they are incident from.

The formulation that the first photodiode layer is fixed to the second photodiode layer means that the first photodiode layer and the second photodiode layer are connected to each other in such a way that they cannot move against each other when the sensor device is used as intended.

The function of the inventive sensor device is as follows: The energy beam to be detected hits one of the two photodiode layers and generates a photocurrent by means of a photoelectric effect. This photocurrent then generates a partial current at each of the at least four measuring contacts, the measuring contacts being arranged on the electrode layers of the respective photodiode layer such that an x coordinate and a y coordinate of the incident energy beam in the photoactive layers of the photodiode layer can be determined from measurements of the at least four partial currents. The associated z-coordinate is constructively predetermined and thus known. In this way, a first point of the energy beam is clearly determined in the three-dimensional space.

Because the photodiode layer by means of which the first point of the energy beam was determined is transparent, a substantial part of the energy of the energy beam reaches the further photodiode layer, so that the energy beam to be detected triggers a further photocurrent in the further photodiode layer due to a further photoelectric effect. This further photocurrent then generates at least four further partial currents at the at least four measuring contacts of the further photodiode layer, which, due to the arrangement of the four measuring contacts of the further photodiode layer, allow determining a further x-coordinate and a further y-coordinate of the energy beam. Here, too, the associated further z-coordinate is constructively predetermined and known. Thus, a second point of the energy beam is now clearly determined in the three-dimensional space.

The direction from which the energy beam is incident is also known by the three-dimensionally clearly determined first point and by the three-dimensionally clearly determined second point. The inventive sensor device thus allows the three-dimensional direction of the energy beam to be determined, whereas conventional sensor devices only allow a one-dimensional or two-dimensional determination of an impact point of the energy beam.

The inventive sensor device can be used in particular in optical measuring instruments for distance measurement and/or angle measurement, wherein the simultaneous measurement of the direction of incidence and the point of impact can increase the accuracy of the respective measurements.

The intended use of organic materials for the photoactive layers of the photodiode layers allows the needed transparency of the respective photodiode layer, which cannot be achieved using conventional photodiode layers in silicon technology. In addition, the intended use of organic materials for the photoactive layers can generate larger photoactive areas than is possible in silicon technology, so that the accuracy of the respective measurements can be further increased. The photoactive layers, the electrode layers and also the other layers described below can be manufactured economically over a large area in a vacuum process or in a printing process.

The inventive component can be used in particular in measuring instruments which work according to the principle of triangulation. The energy beam can be generated by means of a laser. Another possible application is detecting mechanical vibrations. Due to the measuring principle, a very high sensitivity can be achieved. Possible applications are in the field of vibration monitoring of buildings and trains or detecting vibrations for microphones, loudspeakers or pressure sensors. Here, too, the energy beam can be generated by means of a laser.

Such measuring instruments can then be used in particular in aerospace technology, as well as in other areas of mechanical engineering, in medical technology and in many other technical fields.

The achievable accuracy of the sensor device can be further increased by a third photodiode layer, which is fixed to the first photodiode layer, wherein the third photodiode layer comprises one or more organic photoactive layers, which are interposed between two electrode layers of the third photodiode layer, wherein at least four measuring contacts are arranged on the electrode layers of the third photodiode layer, at each of which measuring contacts a partial current of a photocurrent dependent on the incident energy beam can be tapped, so that an x coordinate and a y coordinate in the three-dimensional coordinate system of the incident energy beam in the photoactive layers of the third photodiode layer can be determined from measurements of the at least four partial currents of the third photodiode layer, at least two adjacent photodiode layers of the photodiode layers being transparent.

Of course, other photodiode layers of equivalent setup are also possible.

According to a further development of the invention, the first photodiode layer and the second photodiode layer are arranged on a common substrate layer for supporting the first photodiode layer and the second photodiode layer. In this way, the total number of layers used can be minimized so that the sensor device can be manufactured with a minimized number of manufacturing steps. In this case, the second photodiode layer is fixed directly to the first photodiode layer by the layer structure.

In accordance with a functional further development of the invention, the common substrate layer is transparent, the first photodiode layer and the second photodiode layer being arranged on opposite sides of the common substrate layer as seen in the z-direction. In this case, the common substrate layer additionally assumes the function of a spacer element between the first photodiode layer and the second photodiode layer, so that separate spacers are not used.

In accordance with an advantageous further development of the invention, the first photodiode layer and the second photodiode layer are arranged on a common side of the common substrate layer as seen in the z-direction, with at least one transparent and electrically insulating intermediate layer being interposed between the first photodiode layer and the second photodiode layer. In this way, the manufacturing of the layer structure can be simplified so that all layers can be formed on one and the same side of the substrate one after the other. The intermediate layer can be used to electrically separate the two photodiode layers and/or to mechanically space apart the two photodiode layers from each other.

In accordance with a functional further development of the invention, the common substrate layer is transparent. In this case, it is also possible to detect energy beams that are incident from the direction on which the substrate layer is provided.

According to a functional further development of the invention, the common substrate layer is electrically insulating. If the common substrate layer is interposed between the photodiode layers, an electrical separation of the two photodiode layers can be achieved. If the common substrate layer is not interposed between the photodiode layers, isolation to the outside can be achieved.

In accordance with a functional further development of the invention, the first photodiode layer is disposed on a first substrate layer for supporting the first photodiode layer, wherein the second photodiode layer is disposed on a second substrate layer for supporting the second photodiode layer, and wherein at least one of the substrate layers is transparent. In this way, it is possible to arrange the first photodiode layer and the second photodiode layer to be spaced apart from each other in such a way that a hollow space is created between them. In this way, a large distance can be achieved between the first photodiode layer and the second photodiode layer, as seen in the z-direction, which promotes the accuracy of the sensor device. In addition, virtually no energy from the energy beam is absorbed in the hollow space, further improving the accuracy of the sensor device. The transparent substrate layer of one photodiode layer allows at least a substantial part of the energy of the energy beam to reach the respective other photodiode layer. In this case, the second photodiode layer may be fixed to the first photodiode layer by means not associated with the layer structure. For example, both photodiode layers can be fixed to a housing of the sensor device independently, so that the second photodiode layer is fixed to the first photodiode layer via the housing.

According to an advantageous further development of the invention, at least one filter layer is provided for the adjustment of a spectral sensitivity of the sensor device. This allows the spectral sensitivity of the sensor device to be adapted to its intended field of application. For example, it is possible to shift the spectral sensitivity to the near and mid-infrared range.

In accordance with an advantageous further development of the invention, at least one first conversion layer for converting ionizing radiation into light is associated with the first photodiode layer, at least one second conversion layer for converting ionizing radiation into light being associated with the second photodiode layer. Ionizing radiation is a term for any particle or electromagnetic radiation capable of acquiring electrons from atoms or molecules, leaving behind positively charged ions or molecule residues. In the electromagnetic spectrum, these include in particular: cosmic radiation, gamma radiation, X-rays and shorter wavelength ultraviolet radiation as well as in the particle spectrum: proton beams, electron beams and neutron beams. Conversion layers are now able to convert such ionizing radiation into a wavelength range that can be detected with photodiode layers. In this way, it is possible to detect energy beams consisting of ionizing rays by means of the sensor device according to the invention.

In accordance with a functional further development of the invention, the sensor device has an electronic circuit configured for determining measured values of the at least four partial currents of the first photodiode layer and for determining measured values of the at least four partial currents of the second photodiode layer. The electronic circuit may be located directly on the substrate or independently of it in a common housing with the layer arrangement. In this way, the distance between the point of origin of the partial currents and the point of measurement of the partial currents can be minimized, which further increases the accuracy of the measurement results.

In accordance with an advantageous further development of the invention, the electronic circuit is assigned a data interface for outputting the measured values of the at least four partial currents of the first photodiode layer and for outputting the measured values of the at least four partial currents of the second photodiode layer. The data interface can also be located directly on the substrate or independently of it in a common housing with the layer arrangement. In particular, it can be a standard electrical interface, for example an I2C data bus interface or an SMB data bus interface. In this way, the inventive sensor device can be easily integrated into a higher-level system.

In accordance with a further development of the invention, the at least four measuring contacts of the first photodiode layer comprise two measuring contacts for determining the x-coordinate of the incident energy beam in the photoactive layers of the first photodiode layer, which are arranged at opposite edge regions of one of the electrode layers of the first photodiode layer as viewed in the x-direction of the three-dimensional coordinate system;

wherein the at least four measuring contacts of the first photodiode layer comprise two measuring contacts for determining the y-coordinate of the incident energy beam in the photoactive layers of the first photodiode layer, which measuring contacts are arranged at opposite edge regions of one of the electrode layers of the first photodiode layer as viewed in the y-direction of the three-dimensional coordinate system;

wherein the at least four measuring contacts of the second photodiode layer comprise two measuring contacts for determining the x-coordinate of the incident energy beam in the photoactive layers of the second photodiode layer, which measuring contacts are arranged at opposite edge regions of one of the electrode layers of the second photodiode layer as viewed in the x-direction of the three-dimensional coordinate system; and wherein the at least four measuring contacts of the second photodiode layer comprise two measuring contacts for determining the y-coordinate of the incident energy beam in the photoactive layers of the second photodiode layer, which measuring contacts are arranged at opposite edge regions of one of the electrode layers of the second photodiode layer as viewed in the y-direction of the three-dimensional coordinate system.

The determination of the x-coordinate of the incident energy beam in the first photodiode layer can thus be based on the difference between two partial currents which, viewed in the x-direction, occur at measuring contacts opposite each other at the ends of the electrode layers. The determination of the y-coordinate in the first photodiode layer can be based on the difference between two partial currents, which, seen in the y-direction, occur at measuring contacts opposite each other at the ends of the electrode layers.

Furthermore, the determination of the x-coordinate of the incident energy beam in the second photodiode layer can, as is the case with the first photodiode layer, be based on the difference between two partial currents which, seen in the x-direction, occur at measuring contacts opposite each other at the ends of the electrode layers. As is the case with the first photodiode layer, the determination of the y coordinate in the second photodiode layer can be based on the difference between two partial currents, which, seen in the y direction, occur at measuring contacts opposite each other at the ends of the electrode layers.

BRIEF DESCRIPTION OF THE DRAWINGS

Embodiments of the present invention and its advantages will be described below in more detail referring to the appended drawings, in which.

DETAILED DESCRIPTION OF THE INVENTION

Identical or equivalent elements or elements having identical or equivalent functions are hereinafter referred to by identical or equivalent reference numerals.

In the following description, embodiments with a large number of features of the present invention are described in more detail in order to provide a better understanding of the invention. However, it should be noted that the present invention can also be implemented by omitting some of the features described. It should also be noted that the features shown in various embodiments can also be combined in other ways, unless this is expressly excluded or would lead to contradictions.

Figure 1:
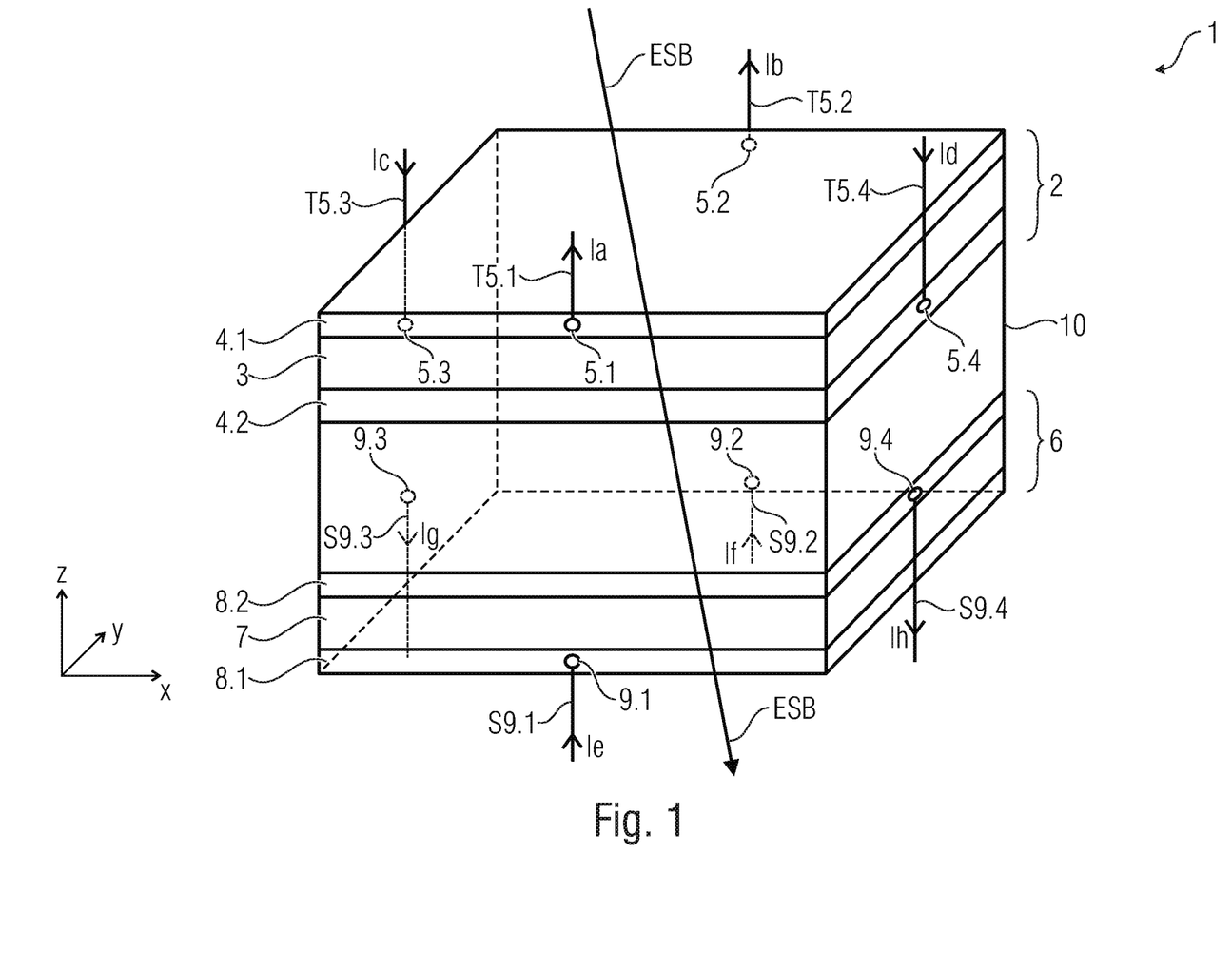
FIG. 1 shows a first embodiment of an inventive sensor device in a schematic spatial representation.

FIG. 1 shows a first embodiment of an inventive sensor device in a schematic spatial representation.

Shown is an exemplary sensor device 1 for detecting an incident energy beam ESB, wherein the sensor device 1 comprises layers stacked in a z-direction of a three-dimensional coordinate system which are aligned parallel to an xy plane of the three-dimensional coordinate system, the layers comprising:

a first photodiode layer 2, the first photodiode layer 2 comprising one or more organic photoactive layers 3, which are interposed between two electrode layers 4.1, 4.2 of the first photodiode layer 2, wherein at least four measuring contacts 5.1, 5.2, 5.3, 5.4 are arranged on the electrode layers 4.1, 4.2 of the first photodiode layer 2, at each of which measuring contacts a partial current T5.1, T5.2, T5.3, T5.3, T5.4 of a photocurrent of the first photodiode layer 2 that is dependent on the incident energy beam ESB can be tapped, so that an x coordinate and a y coordinate in the three-dimensional coordinate system of the incident energy beam EB in the photoactive layers 3 of the first photodiode layer 2 can be determined from measurements of the at least four partial currents T5.1, T5.2, T5.3, T5.4 of the first photodiode layer 2; and a second photodiode layer 6 fixed to the first photodiode layer 2, the second photodiode layer 6 comprising one or more organic photoactive layers 7 which are interposed between two electrode layers 8.1, 8.2 of the second photodiode layer 6, wherein at least four measuring contacts 9.1, 9.2, 9.3, 9.4 are arranged on the electrode layers 8.1, 8.2 of the second photodiode layer 6, at each of which measuring contacts a partial current S9.1, S9.2, S9.3, S9.4 of a photocurrent of the second photodiode layer 6 dependent on the incident energy beam can be tapped, so that an x coordinate and a y coordinate in the three-dimensional coordinate system of the incident energy beam ESB in the photoactive layers 7 of the second photodiode layer 6 can be determined from measurements of the at least four partial currents S9.1, S9.2, S9.3, S9.4 of the second photodiode layer 6;

wherein at least one of the photodiode layers 2, 6 is transparent.

The sensor device 1 consists of (at least) two organic photodiode layers 2, 6, which are stacked one behind the other. Each of these photodiode layers 2, 6 is provided with at least four partial electrodes 5, 9 and thus enables the x, y position of the incident energy beam ESB to be calculated using the partial photocurrents TS.

An incident energy beam ESB passes through the first transparent photodiode layer 2, in which a first x-y coordinate pair is determined. The energy beam ESB is only slightly absorbed. The second photodiode layer 6, which lies behind it in a stacked arrangement, is traversed by the energy beam ESB, which in turn determines an x-y coordinate pair. With the knowledge of the distance of the stacked photodiode layers 2, 6 between each other, a direction vector of the incident light ray can be calculated mathematically. By increasing the number of stacked photodiode layers 2, 6, the accuracy can be increased and possible errors as well as external environmental influences (e.g. temperature, light) can be compensated.

According to an advantageous further development of the invention, the first photodiode layer 2 and the second photodiode layer 3 are arranged on a common substrate layer 10 for supporting the first photodiode layer 2 and the second photodiode layer 6.

In accordance with an advantageous further development of the invention, the common substrate layer 10 is transparent, the first photodiode layer 2 and the second photodiode layer 6 being arranged on opposite sides of the common substrate layer 10 as seen in the z-direction.

According to a functional further development of the invention, the common substrate layer 10 is electrically insulating.

In accordance with a functional further development of the invention, the common substrate layer 10 is transparent.

In accordance with a functional further development of the invention, the at least four measuring contacts of the first photodiode layer comprise two measuring contacts for determining the x-coordinate of the incident energy beam in the photoactive layers of the first photodiode layer, which measuring contacts are arranged at opposite edge regions of one of the electrode layers of the first photodiode layer when viewed in the x-direction of the three-dimensional coordinate system;

wherein the at least four measuring contacts of the first photodiode layer comprise two measuring contacts for determining the y-coordinate of the incident energy beam in the photoactive layers of the first photodiode layer, which measuring contacts are arranged at opposite edge regions of one of the electrode layers of the first photodiode layer as viewed in the y-direction of the three-dimensional coordinate system;

wherein the at least four measuring contacts of the second photodiode layer comprise two measuring contacts for determining the x-coordinate of the incident energy beam in the photoactive layers of the second photodiode layer, which measuring contacts are arranged at opposite edge regions of one of the electrode layers of the second photodiode layer when viewed in the x-direction of the three-dimensional coordinate system; and wherein the at least four measuring contacts of the second photodiode layer comprise two measuring contacts for determining the y-coordinate of the incident energy beam in the photoactive layers of the second photodiode layer, which measuring contacts are arranged at opposite edge regions of one of the electrode layers of the second photodiode layer as viewed in the y-direction of the three-dimensional coordinate system.

When the two photodiode layers 2, 6 are exposed by the ESB energy beam in a point-like manner, a photocurrent is generated whose partial currents T5.1, T5.2, T5.3, T5.4; S9.1, S9.2, S9.3, S9.4 drain via the measuring contacts 5.1, 5.2, 5.3, 5.4; 9.1, 9.2, 9.3, 9.4 located at the edges and assume different values depending on the location of the respective point exposure. Thus, if the z-axis of the coordinate system lies in the center of the layer arrangement, the x-coordinate in the region of the first photodiode layer 2 can be calculated according to the following formula:

$$x1 = kx1(ld-lc)/(ld+lc).$$

$x1$ is the first x-coordinate, $kx1$ a scaling factor, $lc$ the value of the partial current T5.3 and $ld$ the value of the partial current T5.4.

Then, the y-coordinate in the area of the first photodiode layer 2 can be calculated according to the following formula:

$$y1 = ky1(lb-la)/(lb+la).$$

y1 is the first y-coordinate, ky1 a scaling factor, la the value of the partial current T5.1 and lb the value of the partial current T5.2.

Furthermore, the x-coordinate in the region of the second photodiode layer 6 can be calculated according to the following formula:

$$x2 = kx2(lh-lg)/(lh+lg).$$

x2 is the second x-coordinate, kx2 a scaling factor, lg the value of the partial current S9.3 and lh the value of the partial current S9.4.

Then, the y-coordinate in the region of the second photodiode layer 6 can be calculated according to the following formula:

$$y2 = ky2(lf-le)/(lf+le).$$

y2 is the second y-coordinate, ky2 a scaling factor, le the value of the partial current S9.1 and lf the value of the partial current S9.2.

In the first embodiment, the measuring contacts 5.1 and 5.2 are arranged as current outputs on the first electrode layer 4.1 of the first photodiode layer 2. Furthermore, the measuring contacts 5.3 and 5.4 are arranged as current inputs at the second electrode layer 4.2 of the first photodiode layer 2. However, it would also be possible to arrange all four measuring contacts 5.1, 5.2, 5.3 and 5.4 as current outputs at the first electrode layer 4.1 of the first photodiode layer 2, wherein a further contact would then be provided as current input at the second electrode layer 4.2 of the first photodiode layer 2. It would also be possible to arrange all four measuring contacts 5.1, 5.2, 5.3 and 5.4 as current inputs at the second electrode layer 4.2 of the first photodiode layer 2, wherein a further contact would then be provided as current output at the first electrode layer 4.1 of the first photodiode layer 2. With both variations, the above equations retain their validity. The explanations in this paragraph also apply analogously to the four measuring contacts 9.1, 9.2, 9.3 and 9.4 of the second photodiode layer 6.

In a further aspect, the invention relates to a method of manufacturing a sensor device 1 for detecting an incident energy beam ESB, wherein layers stacked in a z-direction of a three-dimensional coordinate system are formed which are aligned parallel to an xy plane of the three-dimensional coordinate system, the method comprising the following steps:

forming a first photodiode layer 2 such that the first photodiode layer 2 comprises one or more organic photoactive layers 3 which are interposed between two electrode layers 4.1, 4.2 of the first photodiode layer 2, so that at least four measuring contacts 5.1, 5.2, 5.3, 5.4 are arranged at the electrode layers 4.1, 4.2 of the first photodiode layer 2, at each of which measuring contacts a partial current T5.1, T5.2, T5.3, T5.4 of a photocurrent dependent on the incident energy beam ESB can be tapped, so that an x coordinate and a y coordinate in the three-dimensional coordinate system of the incident energy beam ESB in the photoactive layers 3 of the first photodiode layer 2 can be determined from measurements of the at least four partial currents T5.1, T5.2, T5.3, T5.4 of the first photodiode layer 2; and forming a second photodiode layer 6 such that the second photodiode layer 6 is fixed to the first photodiode layer 2 so that the second photodiode layer 6 comprises one or more organic photoactive layers 7 interposed between two electrode layers 8.1, 8.2 of the second photodiode layer 6 such that at least four measuring contacts 9.1, 9.2, 9.3, 9.4 are arranged at the electrode layers 8.1, 8.2 of the second photodiode layer 6, at each of which measuring contacts a partial current S9.1, S9.2, S9.3, S9.4 of a photocurrent dependent on the incident energy beam ESB can be tapped, so that an x coordinate and a y coordinate in the three-dimensional coordinate system of the incident energy beam ESB in the photoactive layers 7 of the second photodiode layer 6 are determinable from measurements of the at least four partial currents S9.1, S9.2, S9.3, S9.4 of the second photodiode layer 6;

wherein at least one of the photodiode layers 2, 6 is implemented to be transparent.

Figure 2:
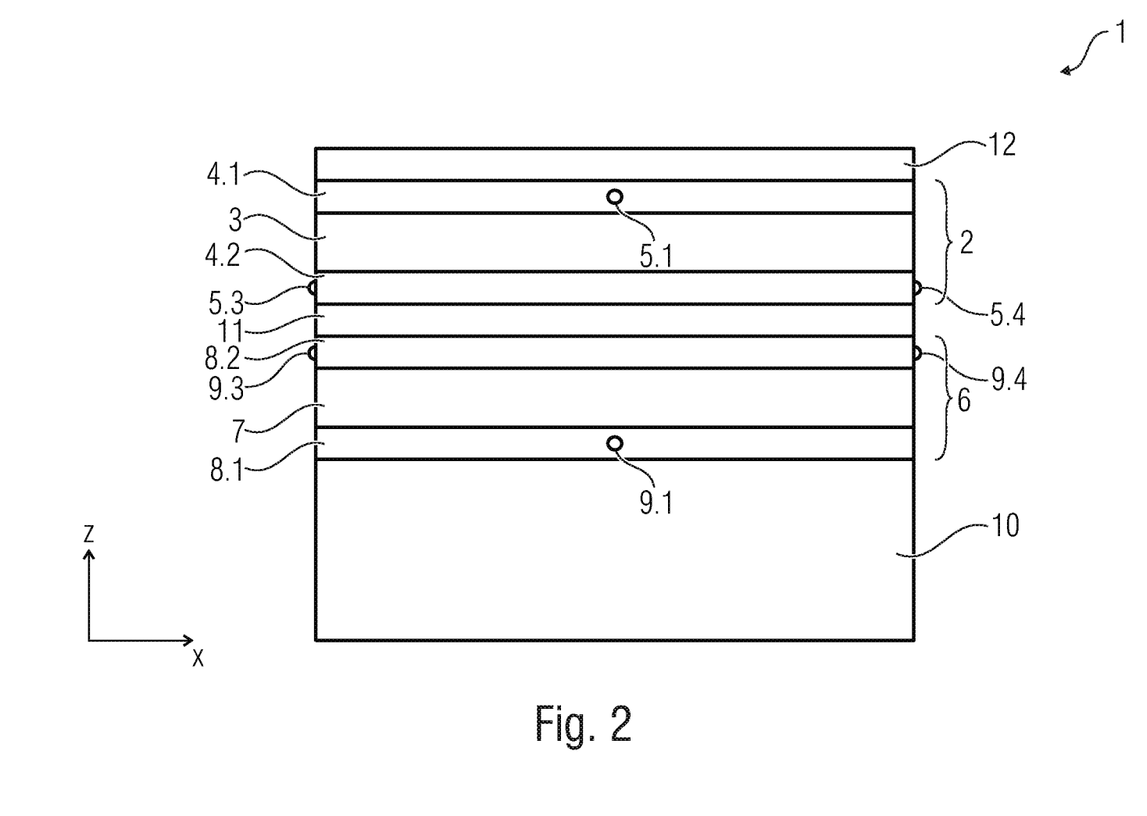
FIG. 2 shows a second embodiment of an inventive sensor device in a schematic side view.

FIG. 2 shows a second embodiment of an inventive sensor device 1 in a schematic side view. Due to the perspective, the measuring contacts 5.2 and 9.2 are not visible, but still present.

In accordance with a functional further development of the invention, the first photodiode layer 2 and the second photodiode layer 6 are arranged on a common side of the common substrate layer 10 as seen in the z-direction, wherein at least one transparent and electrically insulating intermediate layer 11 is interposed between the first photodiode layer 2 and the second photodiode layer 6.

According to an advantageous further development of the invention, at least one filter layer 12 is provided for adjusting a spectral sensitivity of the sensor device 1.

Figure 3:
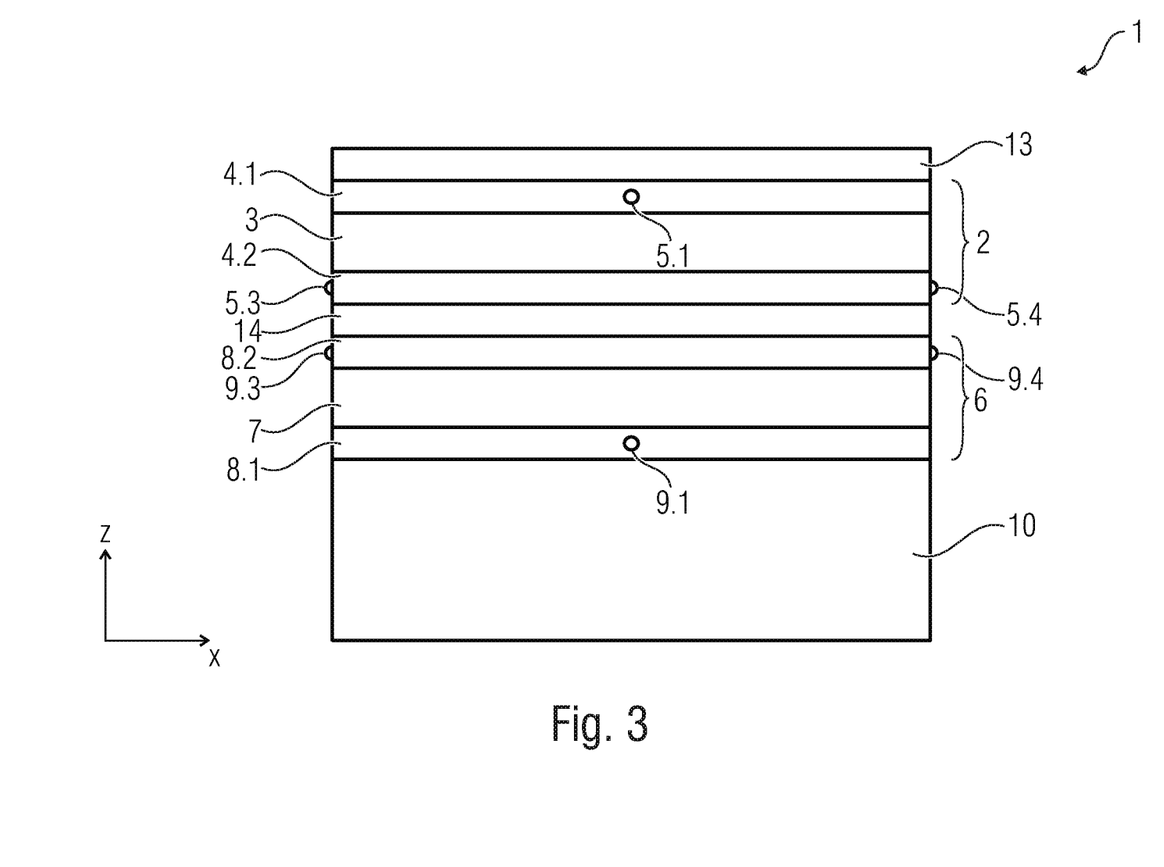
FIG. 3 shows a third embodiment of an inventive sensor device in a schematic side view.

FIG. 3 shows a third embodiment of an inventive sensor device 1 in a schematic side view. The measuring contacts 5.2 and 9.2 are also present here, but are not visible.

In accordance with a functional further development of the invention, at least one first conversion layer 13 for converting ionizing radiation into light is associated with the first photodiode layer 2, wherein at least one second conversion layer 14 for converting ionizing radiation into light is associated with the second photodiode layer 6.

Figure 4:
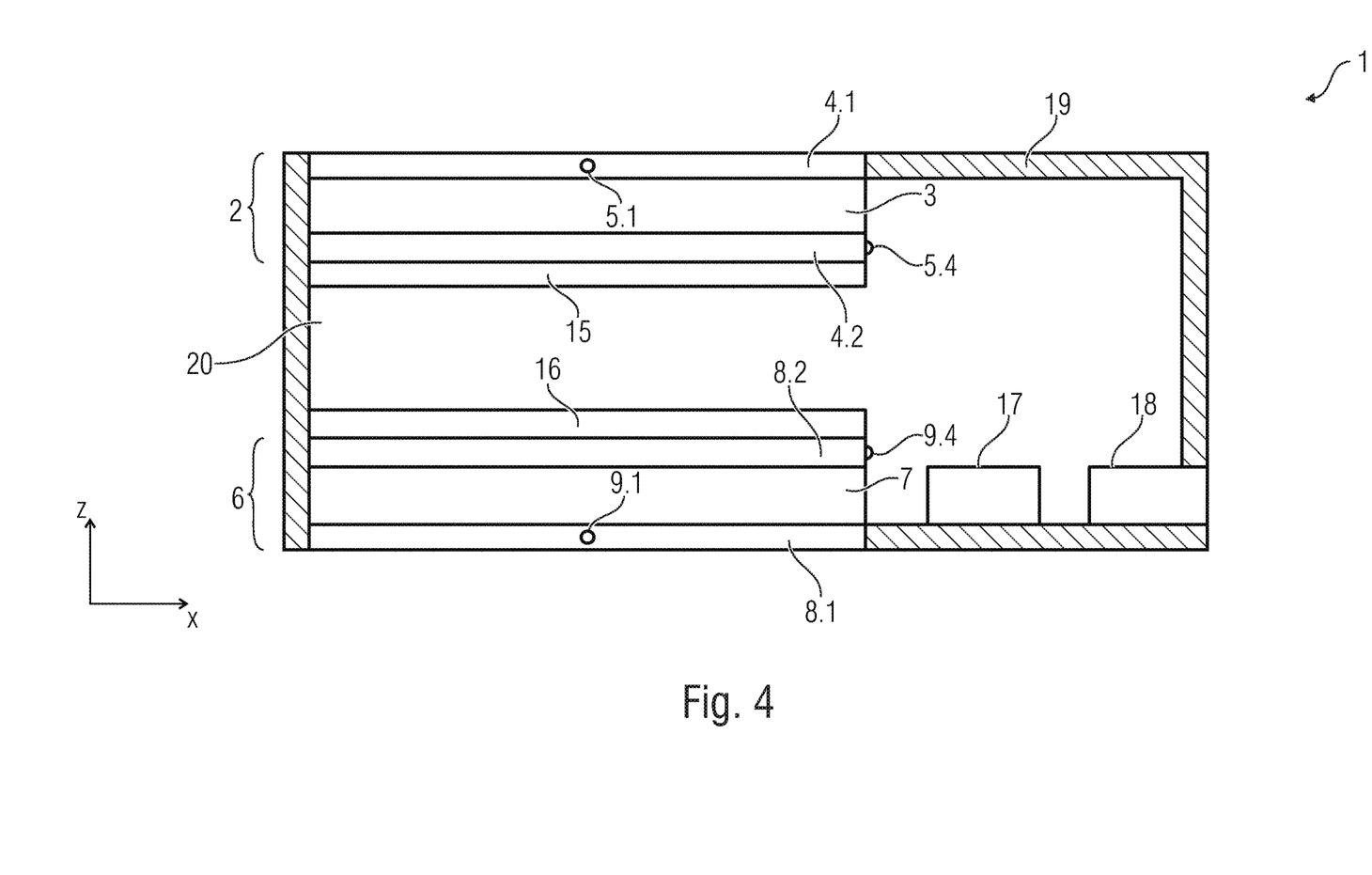
FIG. 4 shows a fourth embodiment of an inventive sensor device in a schematic side view.

FIG. 4 shows a fourth embodiment of an inventive sensor device 1 in a schematic side view, wherein the measuring contacts 5.2 and 9.2 are also hidden here.

In accordance with an advantageous further development of the invention, the first photodiode layer 2 is arranged on a first substrate layer 15 for supporting the first photodiode layer 2, wherein the second photodiode layer 6 is arranged on a second substrate layer 16 for supporting the second photodiode layer 6, and wherein at least one of the substrate layers 15, 16 is transparent.

In accordance with an advantageous further development of the invention, the sensor device 1 has an electronic circuit 17 which is configured for determining measured values of the at least four partial currents T5.1, T5.2, T5.3, T5.4 of the first photodiode layer 2 and for determining measured values of the at least four partial currents S9.1, S9.2, S9.3, S9.4 of the second photodiode layer 6.

In accordance with a functional further development of the invention, a data interface 18 for outputting the measured values of the at least four partial currents T5.1, T5.2, T5.3, T5.4 of the first photodiode layer 2 and for outputting the measured values of the at least four partial currents T5.1, T5.2, T5.3, T5.4 of the second photodiode layer 6 is associated with the electronic circuit 17.

The first photodiode layer 2 and the second photodiode layer 6 are attached independently to a housing 19, so that the second photodiode layer 6 is fixed to the first photodiode layer 2 via the housing 19. The first photodiode layer 2 and the second photodiode layer 6 are spaced apart so that a hollow space 20 is formed. The electronic circuit 17 is also fixed to the housing 19 independently of the other components. However, the electronic circuit 17 could also be arranged directly on the common substrate 10 of FIGS. 1 to 3 or on one of the substrates 15 or 16. The data interface 18 is also arranged on the housing 19. The data interface 18 could also be arranged directly on one of the substrates 10, 15 or 16. In addition, the electronic circuit 17 and the data interface 18 could be combined to form a single functional part.

Aspects of the invention described in connection with a device also concern corresponding methods. Conversely, those aspects of the invention described in connection with a method also concern a corresponding device.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A sensor device for detecting an incident energy beam, the sensor device comprising layers stacked in a z-direction of a three-dimensional coordinate system, which are aligned parallel to an xy plane of the three-dimensional coordinate system, the layers comprising:
   a first photodiode layer, the first photodiode layer comprising one or more organic photoactive layers interposed between two electrode layers of the first photodiode layer, wherein at least four measuring contacts are arranged on the electrode layers of the first photodiode layer, at each of which measuring contacts a partial current of a photocurrent of the first photodiode layer dependent on the incident energy beam can be tapped, so that an x coordinate and a y coordinate in the three-dimensional coordinate system of the incident energy beam in the photoactive layers of the first photodiode layer can be determined from measurements of the at least four partial currents of the first photodiode layer; and
   a second photodiode layer fixed to the first photodiode layer, the second photodiode layer comprising one or more organic photoactive layers interposed between two electrode layers of the second photodiode layer, wherein at least four measuring contacts are arranged on the electrode layers of the second photodiode layer, at each of which measuring contacts a partial current of a photocurrent of the second photodiode layer dependent on the incident energy beam can be tapped, so that an x coordinate and a y coordinate in the three-dimensional coordinate system of the incident energy beam in the photoactive layers of the second photodiode layer can be determined from measurements of the at least four partial currents of the second photodiode layer;
   wherein at least one of the photodiode layers is transparent;
   wherein the first photodiode layer and the second photodiode layer are arranged on a common substrate layer for supporting the first photodiode layer and the second photodiode layer;
   wherein the first photodiode layer and the second photodiode layer are arranged on a common side of the common substrate layer as seen in the z-direction, and wherein at least one transparent and electrically insulating intermediate layer is interposed between the first photodiode layer and the second photodiode layer.

2. The sensor device according to claim 1, wherein the common substrate layer is transparent.

3. The sensor device according to claim 1, wherein the common substrate layer is electrically insulating.

4. The sensor device according to claim 2, wherein the common substrate layer is electrically insulating.

5. The sensor device according to claim 1, wherein at least one filter layer is provided for adjusting a spectral sensitivity of the sensor device.

6. The sensor device according to claim 1, wherein at least one first conversion layer for converting ionizing radiation into light is associated to the first photodiode layer, and at least one second conversion layer for converting ionizing radiation into light is associated to the second photodiode layer.

7. The sensor device according to claim 1, wherein the sensor device comprises an electronic circuit configured for determining measured values of the at least four partial currents of the first photodiode layer and for determining measured values of the at least four partial currents of the second photodiode layer.

8. The sensor device according to claim 7, wherein the electronic circuit is assigned a data interface for outputting the measured values of the at least four partial currents of the first photodiode layer and for outputting the measured values of the at least four partial currents of the second photodiode layer.

9. The sensor device according to claim 1, wherein the at least four measuring contacts of the first photodiode layer comprise two measuring contacts for determining the x-coordinate of the incident energy beam in the photoactive layers of the first photodiode layer, which measuring contacts are arranged at opposite edge regions of one of the electrode layers of the first photodiode layer as viewed in the x-direction of the three-dimensional coordinate system;
   wherein the at least four measuring contacts of the first photodiode layer comprise two measuring contacts for determining the y-coordinate of the incident energy beam in the photoactive layers of the first photodiode layer, which measuring contacts are arranged at opposite edge regions of one of the electrode layers of the first photodiode layer as viewed in the y-direction of the three-dimensional coordinate system;
   wherein the at least four measuring contacts of the second photodiode layer comprise two measuring contacts for determining the x-coordinate of the incident energy beam in the photoactive layers of the second photodiode layer, which measuring contacts are arranged at opposite edge regions of one of the electrode layers of the second photodiode layer as viewed in the x-direction of the three-dimensional coordinate system; and
   wherein the at least four measuring contacts of the second photodiode layer comprise two measuring contacts for determining the y-coordinate of the incident energy beam in the photoactive layers of the second photodiode layer, which measuring contacts are arranged at opposite edge regions of one of the electrode layers of the second photodiode layer as viewed in the y-direction of the three-dimensional coordinate system.

10. A method of manufacturing a sensor device for detecting an incident energy beam, wherein layers stacked in a z-direction of a three-dimensional coordinate system are formed which are aligned parallel to an xy plane of the three-dimensional coordinate system, the method comprising:

forming a first photodiode layer such that the first photodiode layer comprises one or more organic photoactive layers which are interposed between two electrode layers of the first photodiode layer, so that at least four measuring contacts are arranged on the electrode layers of the first photodiode layer, at each of which measuring contacts a partial current of a photocurrent dependent on the incident energy beam can be tapped, so that an x coordinate and a y coordinate in the three-dimensional coordinate system of the incident energy beam in the photoactive layers of the first photodiode layer can be determined from measurements of the at least four partial currents of the first photodiode layer; and forming a second photodiode layer such that the second photodiode layer is fixed to the first photodiode layer so that the second photodiode layer comprises one or more organic photoactive layers interposed between two electrode layers of the second photodiode layer so that at least four measuring contacts are arranged on the electrode layers of the second photodiode layer, at each of which measuring contacts a partial current of a photocurrent dependent on the incident energy beam can be tapped, so that an x coordinate and a y coordinate in the three-dimensional coordinate system of the incident energy beam in the photoactive layers of the second photodiode layer can be determined from measurements of the at least four partial currents of the second photodiode layer;

wherein at least one of the photodiode layers is implemented to be transparent;

wherein the first photodiode layer and the second photodiode layer are arranged on a common substrate layer for supporting the first photodiode layer and the second photodiode layer;

wherein the first photodiode layer and the second photodiode layer are arranged on a common side of the common substrate layer as seen in the z-direction, and wherein at least one transparent and electrically insulating intermediate layer is interposed between the first photodiode layer and the second photodiode layer.

* * * * *